United States Patent [19]

Boys

[11] Patent Number: 5,215,639

[45] Date of Patent: Jun. 1, 1993

[54] COMPOSITE SPUTTERING TARGET STRUCTURES AND PROCESS FOR PRODUCING SUCH STRUCTURES

[75] Inventor: Donald R. Boys, Cupertino, Calif.

[73] Assignee: Genus, Inc., Mountain View, Calif.

[21] Appl. No.: 671,164

[22] Filed: Mar. 14, 1991

Related U.S. Application Data

[63] Continuation of Ser. No. 363,414, Jun. 5, 1989, abandoned, which is a continuation of Ser. No. 111,142, Oct. 16, 1987, abandoned, which is a continuation of Ser. No. 658,735, Oct. 9, 1984, abandoned.

[51] Int. Cl.$^5$ ............................................. C23C 14/34
[52] U.S. Cl. .............................. 204/192.12; 156/242; 204/298.12
[58] Field of Search ................ 204/192.12, 298.12; 156/242, 245; 228/171, 173.6, 179; 419/8, 66, 68; 428/552, 553; 445/49

[56] References Cited

U.S. PATENT DOCUMENTS

| | | | |
|---|---|---|---|
| 3,620,957 | 11/1971 | Crawley et al. | 204/298 |
| 3,669,871 | 6/1972 | Elmgren et al. | 204/298 |
| 3,956,093 | 5/1976 | McLeod | 204/192 |
| 4,060,470 | 11/1977 | Clarke | 204/192 |
| 4,135,286 | 1/1979 | Wright et al. | 29/420 |
| 4,162,954 | 7/1979 | Morrison, Jr. | 204/298 |
| 4,166,018 | 8/1979 | Chapin | 204/192 R |
| 4,169,031 | 9/1979 | Brors | 204/192 R |
| 4,180,450 | 12/1979 | Morrison, Jr. | 204/298 |
| 4,194,962 | 3/1980 | Chambers et al. | 204/298 |
| 4,198,283 | 4/1980 | Class et al. | 204/298 |
| 4,200,510 | 4/1980 | O'Connell et al. | 204/192 |
| 4,204,936 | 5/1980 | Hartsough | 204/192 |
| 4,209,375 | 6/1980 | Gates et al. | 204/192 |
| 4,219,397 | 8/1980 | Clarke | 204/192 |
| 4,239,611 | 12/1980 | Morrison, Jr. | 204/298 |
| 4,265,729 | 5/1981 | Morrison, Jr. | 204/298 |
| 4,282,083 | 8/1981 | Kertesz et al. | 204/298 |
| 4,299,678 | 11/1981 | Meckel | 204/192 |
| 4,309,266 | 1/1982 | Nakamura et al. | 204/298 |
| 4,312,731 | 1/1982 | Morrison, Jr. | 204/298 |
| 4,324,631 | 4/1982 | Meckel et al. | 204/192 |
| 4,341,816 | 7/1982 | Lauterbach et al. | 427/34 |
| 4,361,472 | 11/1982 | Morrison, Jr. | 204/192 R |
| 4,370,217 | 1/1983 | Funaki | 204/298 |
| 4,389,299 | 6/1983 | Adachi et al. | 204/298 |
| 4,391,697 | 7/1983 | Morrison, Jr. | 204/298 |
| 4,392,939 | 7/1983 | Crombeen et al. | 204/298 |
| 4,401,539 | 8/1983 | Abe et al. | 204/192 R |
| 4,401,546 | 8/1983 | Nakamura et al. | 204/298 |
| 4,405,436 | 9/1983 | Kobayashi et al. | 204/298 |
| 4,414,086 | 11/1983 | Lamont, Jr. | 204/192 M |
| 4,417,968 | 11/1983 | McKelvey | 204/192 |
| 4,421,628 | 12/1983 | Quaderer | 204/298 |
| 4,461,688 | 7/1984 | Morrison, Jr. | 204/192 R |
| 4,498,969 | 2/1985 | Ramachandran | 204/298 |
| 4,500,409 | 2/1985 | Boys et al. | 204/298 |
| 4,517,070 | 5/1985 | Kisner | 204/298 |

FOREIGN PATENT DOCUMENTS 59-133370  7/1984  Japan .............................. 204/298

OTHER PUBLICATIONS

J. L. Vossen et al., *Thin Film Processes*, Academic Press, New York, 1978, pp. 31-33, 41-42, 138-141.

Coating Deposition by Sputtering, by John Thornton published 1982.

Memorandum, U.S. District Court, Civ. Nos. 80-648, 80-1568.

*Primary Examiner*—John Niebling
*Assistant Examiner*—William T. Leader
*Attorney, Agent, or Firm*—Joseph A. Smith

[57] ABSTRACT

A target structure is provided for use in a magnetically enhanced diode sputter coating source having a sputtering target which at end-of-life has an eroded surface with a known shape. The sputtering target has a non-sputtered profiled back surface conforming substantially in shape to the eroded surface at end-of-life. A backing plate is bonded to the sputtering target which has a bonding surface complementary to the non-sputtered back surface of the sputtering target and is designed to mate therewith. A method is provided for fabricating the target structure and bonding the sputtering target to the backing plate by isostatic pressing.

3 Claims, 12 Drawing Sheets

COMPOSITE SPUTTERING TARGET STRUCTURES AND PROCESS FOR PRODUCING SUCH STRUCTURES

This is a continuation of application Ser. No. 363,414 filed Jun. 5, 1989 now abandoned, which is a continuation of Ser. No. 111,142 filed Oct. 16, 1987, now abandoned, which is a continuation of Pat. No. 658,735 filed Oct. 9, 1984, now abandoned.

BACKGROUND OF THE INVENTION

The present invention relates to target structures that are used to provide sputtering material for sputter coating sources, and particularly to such sources which are made up of a composite of materials and the techniques for their fabrication.

Sputtering, is a process that falls in the general class of vacuum coating processes, which are used to deposit a thin layer of a desirable material on the surface or surfaces of another object to provide a particular function or to enhance the appearance of the object. As an example, thin films of aluminum or aluminum alloys, on the order of a micrometer in thickness, are applied to silicon wafers in the production of integrated circuits to form the electrical connections between individual semiconductor devices. As another example, thin films of aluminum, chrome, brass, and other metals are applied to the surfaces of plastic objects, such as automotive headlamp bezels, door handles, and door lock plungers, to give those objects a pleasing metallic appearance.

The sputtering process is a plasma process by which positive ions of an inert gas impinge upon the surface of a target material, which is the material used to form the desired film. As an example, in a sputtering process of coating a plastic object with a thin film of chromium alloy, the target material would be the chromium alloy. Sputtering is accomplished from a device called a sputter coating source. Such a source embodies electrical means for biasing a target material structure with a negative voltage, either DC for conductive targets, or RF for non-conductive targets, so the target will attract positive ions from a plasma of an inert gas that is established in the region of the target. The sputter coating source also contains means for cooling the target structure and often magnetic means for containing and enhancing the plasma.

Positive ions extracted from the plasma are accelerated to a high kinetic energy and strike the surface of the target structure, where part of the kinetic energy is changed to heat, and part is imparted by momentum transfer to atoms of the target material. Atoms that gain sufficient energy to overcome their binding energy escape from the target surface and are ejected into the vacuum chamber that houses the process. Objects placed in line-of-sight of an operating source are coated by the atoms ejected from the target surface.

Because target material is used up in the sputtering process, sputter coating sources are designed and built so that used targets can be removed and new targets mounted at intervals. The mounting of a new target structure is called replenishment.

There are many kinds and shapes of sputtering sources, and therefore many sizes and shapes of sputtering target structures, including round disks, conical shapes, and rectangular shapes. Regardless of the design and shape of a sputter coating source and the resulting profile of a demountable target structure, all have a problem: not all of the target material is depleted before the target must be changed to avoid erosion of the source itself. The requirements for providing a self-sustaining plasma and the way ions are attracted to the target surface are such that a perfectly even erosion over a target surface cannot be maintained in practice. The inevitable result is that erosion is preferential in a particular pattern that is a function of the source design. This effect is true for sources known as magnetically enhanced diode sputtering sources, hereinafter, magnetrons, in which a magnetic field is used to enhance and maintain the plasma. Whereas in triode sources and in diode sources using a cylindrical hollow cathode, this preferential pattern of erosion is not a significant practical problem.

FIGS. 1A, 1B and 1C illustrate an example of the prior art corresponding to a one-piece target structure for a diode sputter coating source known as a rectangular planar magnetron. A rectangular target structure 11 has a surface 12 which, during deposition, is presented to the plasma in conjunction with the sputter coating source. The surface is typically flat and of uniform thickness before sputtering erosion begins. The confinement of the plasma by the magnetic field of the sputter coating source is such that erosion is preferential in an area 13 of the surface presented to the plasma. As erosion proceeds most material is eroded from area 13. When erosion has proceeded nearly through the target structure, so that further erosion might damage the sputter coating source to which the target is attached, the erosion profile is typically as shown in the two section views FIG. 1B and FIG. 1C, as profile surface 14. At that point in the operation, the target structure can no longer be used and must be removed from the sputter coating source and replaced by a new target structure. The cross-hatched portions 15 of FIG. 1B and FIG. 1C indicate target material that is not used in the sputtering operation. The unshaded area 16 represents material that has been sputtered away to form a substrate film, although not all of this material reaches the substrate. The ratio of sputtered material to unused material in the target structure is seldom greater than 40 percent for a rectangular planar magnetron sputter coating source.

FIGS. 2A and 2B show a plan view and cross-sectional view, respectively, of a prior art target structure for a round planar magnetron which includes a means of mechanically manipulating the magnets to increase the erosion area. The target structure is labelled 21, the uneroded original surface is labelled 22, the preferential erosion area is labelled 23, the erosion profile at end-of-life is labelled 24, the unused volume is labelled 25, and the sputtered volume is labelled 26. In this type of round magnetron source, the ratio of used to unused material is higher than for a rectangular planar magnetron, but is seldom more than 60 percent.

FIGS. 3A and 3B show a plan view and a cross-sectional view, respectively, of a prior art target structure for a typical conical magnetron sputter coating source. The target structure is labelled 31, the uneroded original surface is labelled 32, the preferential erosion area is labelled 33, the erosion profile at end-of-life is labelled 34, the unused volume is labelled 35, and the sputtered volume is labelled 36. With this type of source the ratio of used to unused material may be as high as 70 percent.

Of primary interest for the purpose of the present invention is the fact that the end-of-life profile for a sputtering target is a function of the sputter coating source, and is a known quantity which can be determined emperically with a very small margin of error for each type of source. As a result, in a production process with a particular sputtering machine and using a particular sputter coating source, the used targets have the same profile, within small limits of deviation.

In the general art of sputtering target fabrication, there are several methods of forming the target material, and the method used is generally chosen as a result of the physical properties of the material. For metals with relatively low melting points, and mixtures of these that form alloys, the most often used method is vacuum melting. The materials are mixed, melted together, and poured into a mold in a vacuum furnace, which helps in outgassing volatile constituents of the mix. After vacuum casting and cooling, the resulting ingot, often weighing several hundred pounds, is sliced and machined to the desired final shapes to be joined to a particular sputter coating source. Vacuum melting helps to provide purity and homogeneous alloys, and results in materials that do not outgas into the vacuum chamber as sputtering proceeds. One disadvantage of this method is that it is not energy efficient. Also, a considerable amount of expensive machining must be employed to provide the final target profile.

Materials with high melting points, and mixtures of materials with one or more of the constituents having high melting points, such as the refractory metals, are formed by the arts of powder metallurgy. The constituents are reduced to a powder form, then the powders are mixed and placed in a mold. Applications of pressure and temperature are used to compact the powders to the point that the powders adhere and form a single, solid structure. The compacted shape is then machined to the final dimensions to be joined to a particular sputter coating source. The methods of powder metallurgy have the advantage of fabrication to near net shape, avoiding much of the machining requirements associated with vacuum melting techniques. There have been disadvantages to powder metallurgy targets in the past, the most critical being the inability of the target manufacturers to achieve high density materials. Gasses trapped in low density materials are released during sputtering and contaminate the sputtering process. Also, low density materials do not have the strength of vacuum melted materials, and do not stand up well to thermal stresses and clamping requirements in the sputtering process.

There are other methods sometimes used to form target materials, such as chemical vapor deposition from hydro-carbon gasses to form high purity carbon and graphite, and chemical techniques for targets that are chemical compounds, such as metal oxides.

Regardless of the method used to form the target material, the material must finally be formed to a final shape, such as a disk, a cone, a rectangle, or a square, depending on which profile is required for the particular sputter coating source to be used. Some materials used in sputter coating processes are very difficult to machine, others are fragile, and others are porous. Also the target requirement is sometimes for a profile that is larger in diameter or in length and breadth than can be provided in a single piece by the fabrication method used. It is therefore a common practice to fabricate targets with a backing plate of copper or some other material with good electrical and thermal conductivity, and the desired sputtering material is bonded to the backing plate. In the case of fragile materials, such as carbon and ceramic materials, a backing plate is nearly always used.

The two general methods of bonding to backing plates are by soldering techniques employing low melting point materials, such as indium, lead, and tin, and by adhesive bonding with usually thermosetting adhesives, such as epoxies, which are filled with copper, aluminum, or other powders to provide heat and electrical conductivity.

There are disadvantages to both of these bonding techniques. The solder techniques limit the power density that can be applied to a target to a point that the target temperature will not exceed the melting point of the solder material. The adhesive technique also limits the power density applicable because of the generally poor heat conductivity of the filled thermosetting adhesive.

Given the above-described disadvantages of standard target shapes in achieving full use of the target material and the disadvantages of present bonding techniques of the target to the backing plate, what is needed is a new target structure which can achieve as nearly as practicable, complete use of the expensive target materials and a method of joining that target structure to a suitable backing plate.

SUMMARY OF THE INVENTION

In accordance with preferred embodiments of the invention, a target structure for use in a magnetically enhanced diode sputter coating source other than a cylindrical hollow cathode source is provided having a sputtering target which at end-of-life has an eroded surface with a known shape. The sputtering target has a non-sputtered, profiled, curvilinear, back surface conforming in shape to the eroded surface at end-of-life. A backing plate is bonded to the sputtering target for support, the backing plate having a bonding surface complementary to the end-of-life shape of the sputtering target and designed to mate therewith. In the preferred mode, the sputtering target and the backing plate are constructed of molded materials and are joined by compression bonding, preferably isostatic pressing. In another embodiment, a third, or bonding, material is placed between the target and the backing plate and the three pieces are compression bonded together. This latter embodiment is used in those situations where the backing plate and target material are of low plasticity and the third material is comparatively softer. In another embodiment, the sputtering target has a non-sputtered back surface which is profiled using a plurality of planar surfaces to approximate the shape of the eroded surface at end-of-life, and the backing plate is profiled accordingly to mate therewith.

A method is presented for making a target structure having the steps of selecting a target material with a known end-of-life profile, forming a first surface on the target material having substantially that end-of-life profile, forming a second surface on a backing plate, the second surface being complementary to the first surface, and then bonding the first surface to the second surface.

An important advantage of the invention is that such composite targets reduce the amount of expensive sputtering material remaining at end-of-life. Also, the power densities that can be used with a profiled, bonded, target are higher than is typical of a target where most or all of the target is sputtering material.

DETAILED DESCRIPTION OF THE INVENTION

Figure 1A:
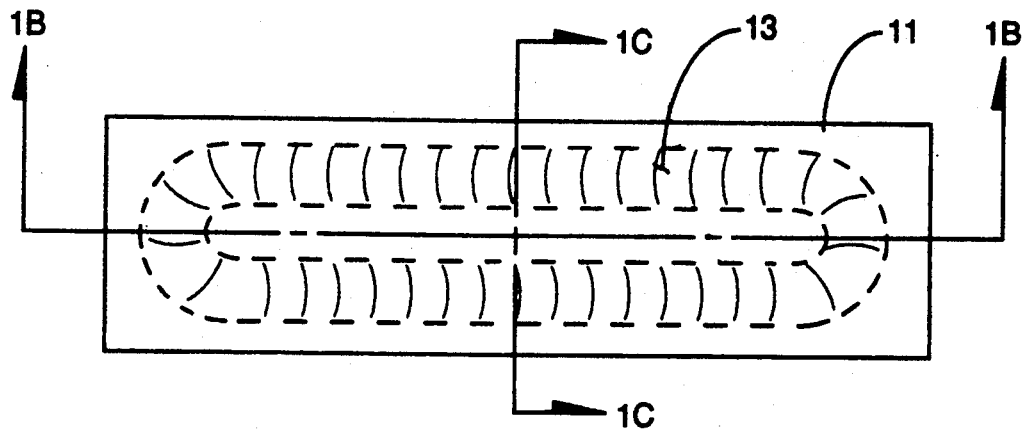
FIG. 1A shows a plan view of a prior art target structure for use in a rectangular planar magnetron sputter coating source.
Figure 1B:
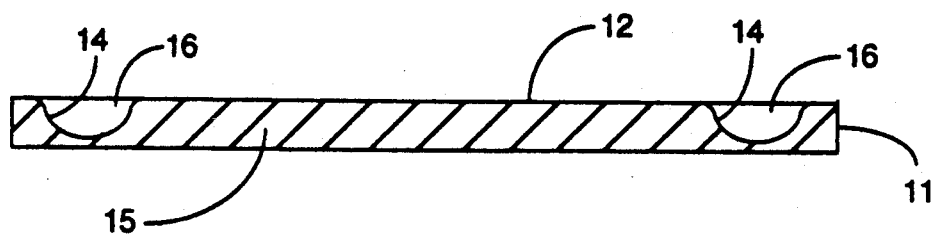
FIGS. 1B and 1C show cross-sectional views of the target structure of FIG. 1A through a section A—A, and section B—B, respectively.
Figure 1C:
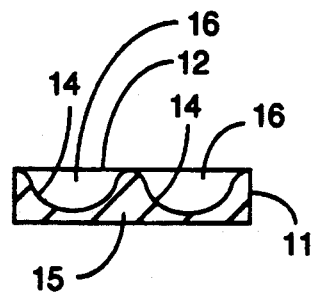
Figure 2A:
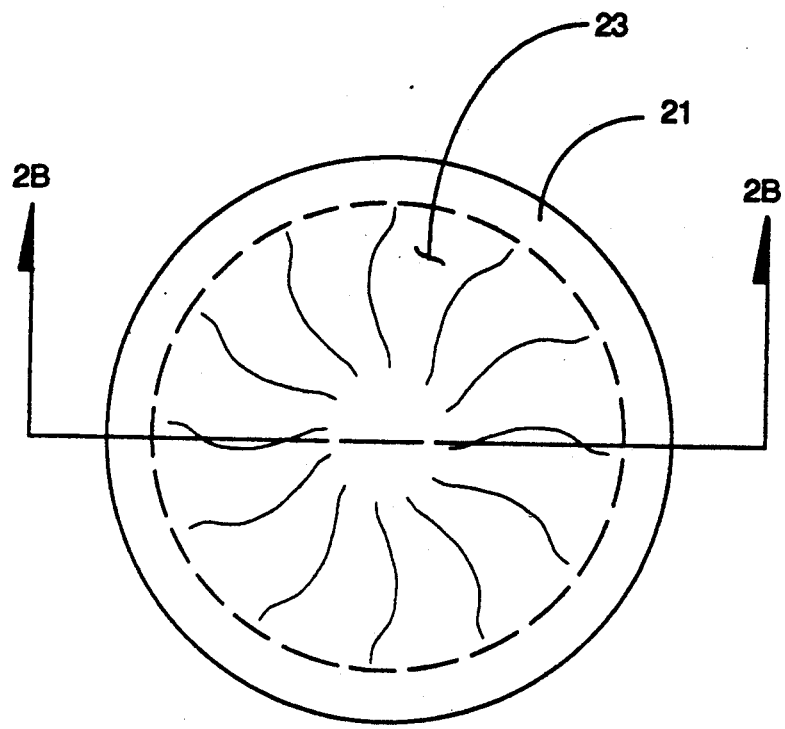
FIG. 2A shows a plan view of a prior art target structure for use in a round planar magnetron sputter coating source.
Figure 2B:
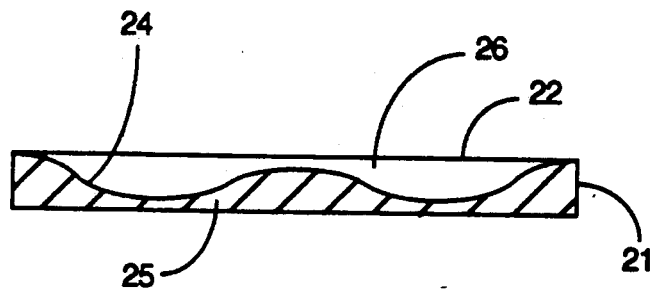
FIG. 2B shows a cross-sectional view of the target structure shown in FIG. 1A through a section A—A.
Figure 3A:
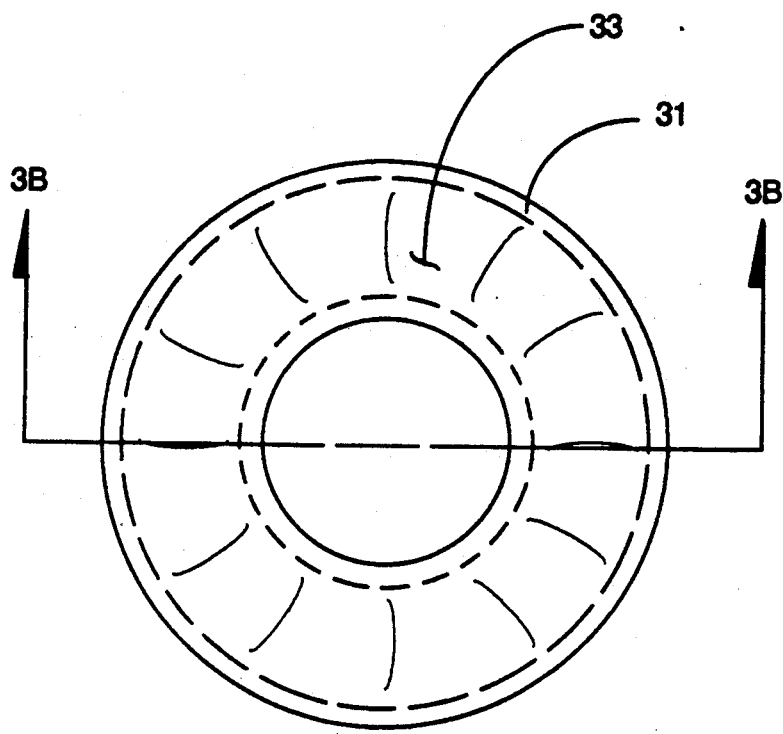
FIG. 3A shows a plan view of a prior art target structure for use in a conical magnetron sputter coating source.
Figure 3B:
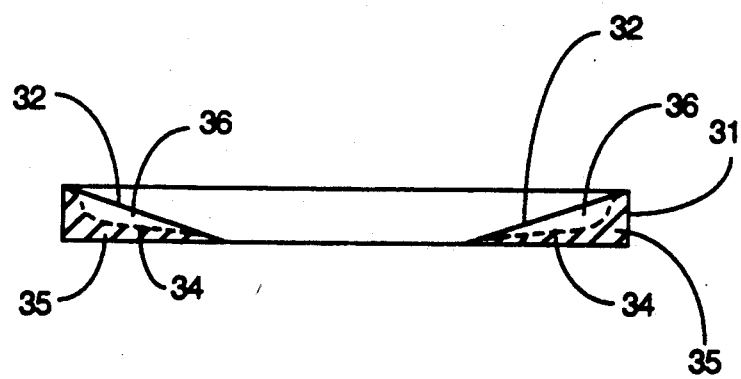
FIG. 3B shows a cross-sectional view of the target structure shown in FIG. 3A through a section A—A.
Figure 4A:
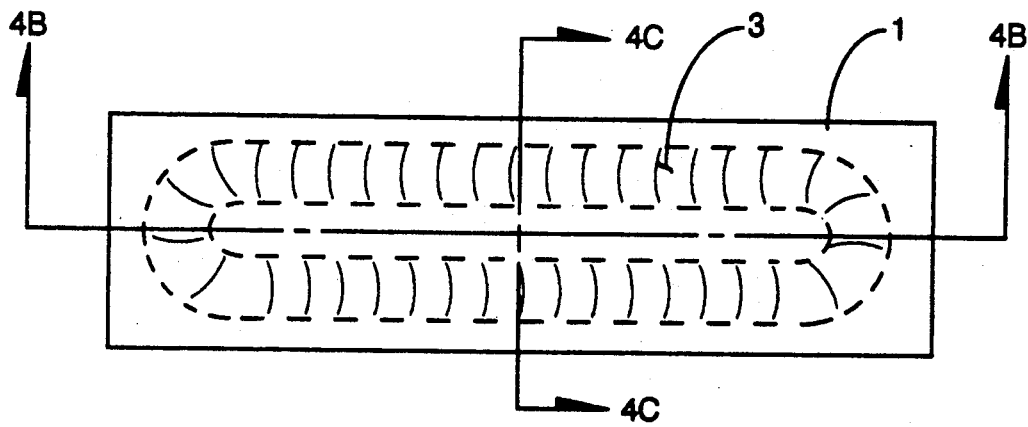
FIG. 4A shows a plan view of a composite target structure according to the invention for use in a rectangular planar magnetron sputter coating source.
Figure 4B:
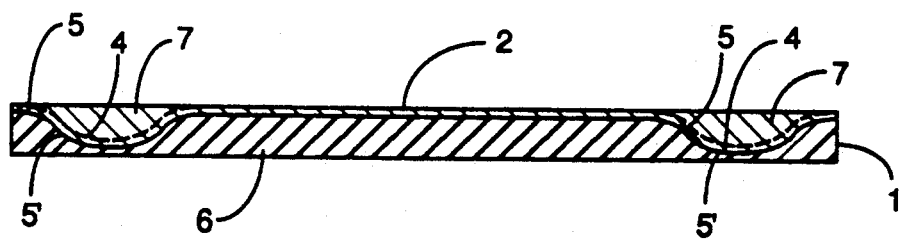
FIGS. 4B and 4C show cross-sectional views of the target structure shown in FIG. 4A through a section A—A and a section B—B, respectively.
Figure 4C:
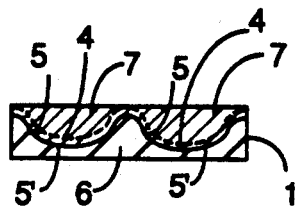

Shown in FIGS. 4A, 4B, and 4C is a composite target structure according to the invention such as may be used in a rectangular planar magnetron sputter source. The target structure has a backing plate 1, and a target material 7 attached thereto. Backing plate 1 is prepared of a relatively inexpensive material, such as copper or aluminum, which has good thermal and electrical conductivity, and which has the physical strength to support the target material in the source structure. Target 7 has a profiled curvilinear surface 5 and backing plate 1 has a complementary, profiled, curvilinear surface 5' which mates with profiled surface 5 to form a rectangular plate structure having an external shape similar to that of the prior art device shown in FIG. 1. Surface 2 represents the uneroded surface of the target material and dotted surface 4 represents the surface remaining after erosion to end-of-life during the sputtering process. Profiled surface 5 is chosen to conform closely to the end-of-life shape of the target material based on previously gathered empirical information pertaining to the particular type of source used. Thus the only expensive target material remaining after the target is spent is a very thin layer represented by the region between surfaces 4 and 5. In practice this layer may be quite thin depending on when the user actually stops the sputtering process. Thus the material efficiency, i.e., the ratio of sputtered target material to unsputtered target material, is very high, well above 70%, and can approach 100% depending on the thickness of the target material it is desired to leave at end of life. In practice, to avoid sputtering the target backing material, the thin layer of sputtering material remaining at end-of-life in the predominantly sputtered area is nominally about 60 mils, but in some areas may be smaller, and in others as large as 120 mils or 180 mils depending on how well the end-of-life shape is matched.

It will be evident to those skilled in the art of sputter target fabrication, that if profiled surfaces 5 and 5' of the target and backing plate must be machined from larger pieces of material, the cost of machining may offset the advantage obtained in the material efficiency. Hence, techniques such as powder metallurgy where only finish machining is required, or vacuum forming, vacuum casting, or explosion forming can be used so that machining costs are no more than that usually encountered for targets which are not profiled.

Figure 5A:
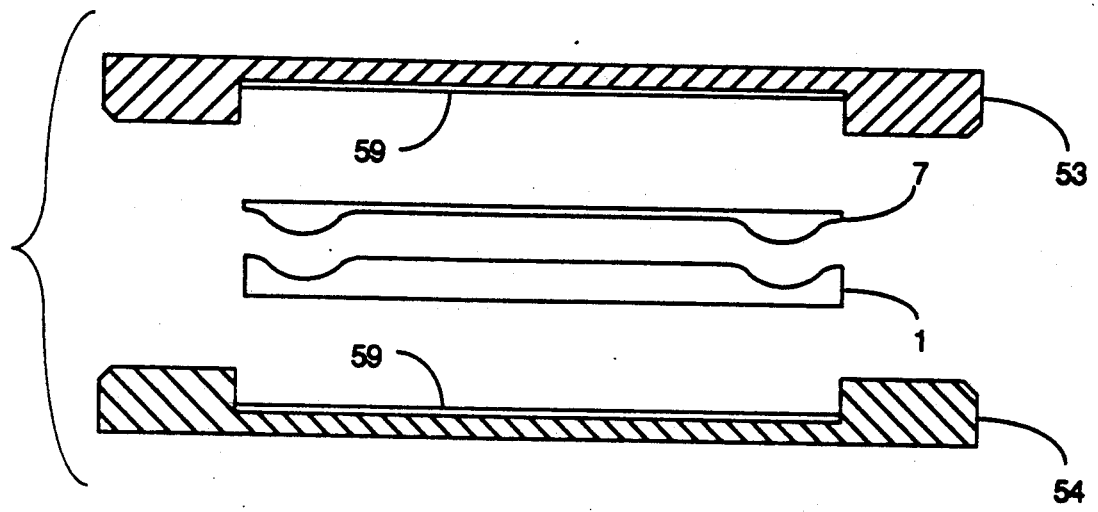
FIG. 5A shows an expanded cross-sectional view of a target and backing plate according to the invention, and a mold used for isostatically pressing the target and backing plate together to form a bond.
Figure 5B:
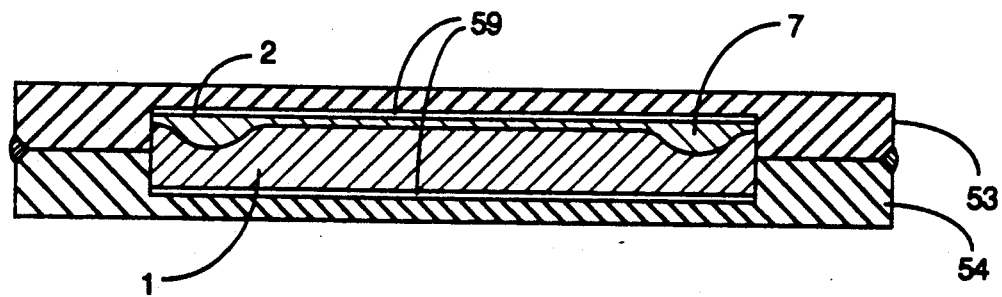
FIG. 5B shows a cross-sectional view of the apparatus of FIG. 5A in its closed form.
Figure 5C:
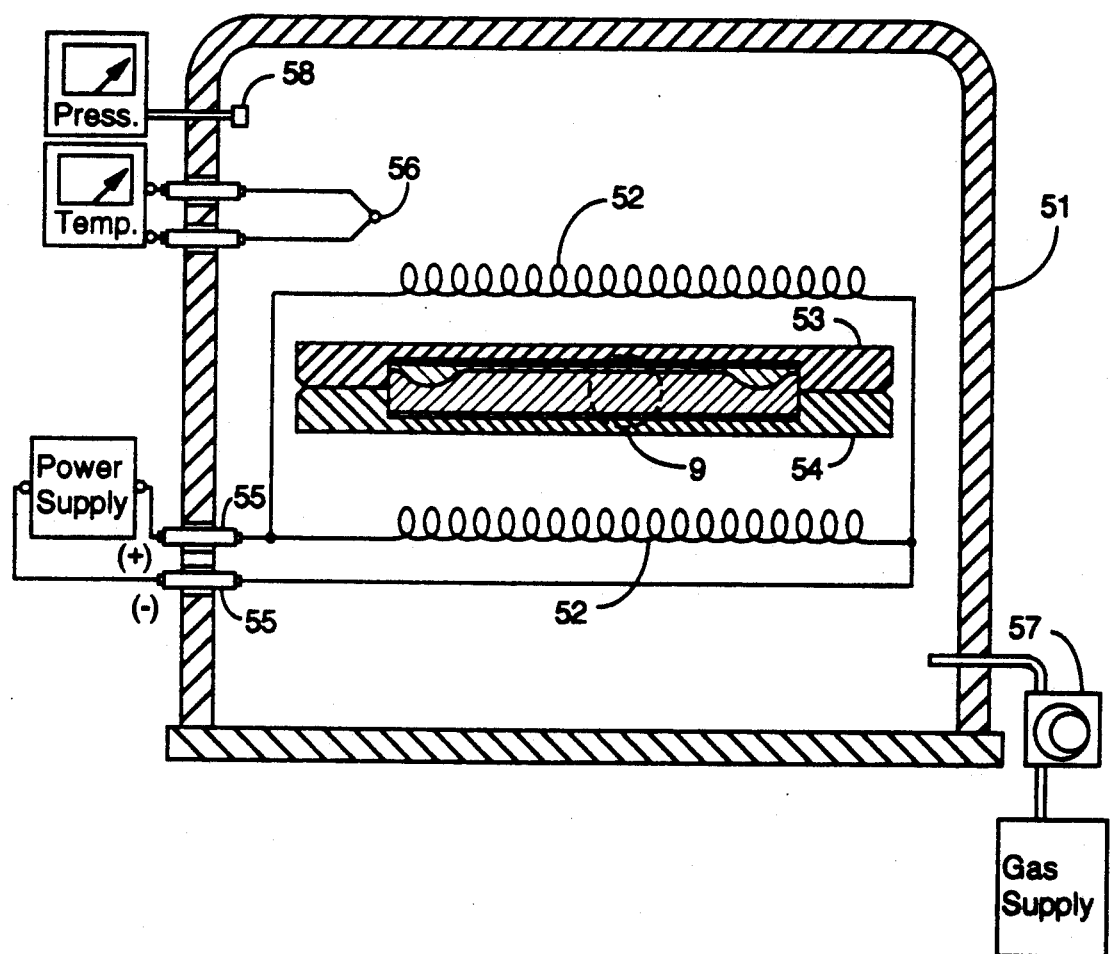
FIG. 5C shows a cross-sectional view of an isostatic pressing apparatus and its relationship to the target, backing plate, and mold.

The method of attaching the target to the backing can be by soldering or by epoxy bonding as in the prior art. However, for appropriate materials, compression bonding techniques are preferred, including cold pressing, hot pressing, and vacuum sintering, and more preferably the technique of isostatic pressing, including cold isostatic pressing (hereinafter called CIP) and hot isostatic pressing (hereinafter called HIP). Apparatus for isostatic pressing processes is illustrated in FIGS. 5A, 5B and 5C.

A metal mold of pieces 53 and 54 is prepared with a machined internal cavity which has the shape that the pieces, target material 7 and the backing plate 1 will have when they are joined. The target material and the backing plate are placed in this mold, and the mold is closed, so that the surfaces of the two pieces to be joined are in contact within the mold cavity. To prevent adhesion of metal mold pieces 53 and 54 to the sputtering material 7 and backing plate 1, respectively, nonadhering ceramic liners 59 are used between the metal mold pieces and the sputtering material and backing plate as shown. Materials for such liners are well known in the art and include $Al_2O_3$ and BN. The mold is then sealed with the two pieces, the target material and the backing plate, inside as shown in FIG. 5B. This seal may be accomplished by welding, or by other sealing or clamping methods sufficient to prevent a gas at a pressure equal to the pressure required to form the bond, from leaking through the seal from the outside to the inside of the mold. The mold is then placed in an isostatic chamber 51 such as that illustrated in FIG. 5C. The walls of the isostatic chamber 51 are constructed to withstand very high pressures, of the order of tens of thousands of pounds per square inch. Also contained within the chamber is a means of supplying heat, for example high resistance wire filaments 52, which are connected together with sealed penetrations 55 for electric current to be applied from outside to heat the filaments. A typical system also includes a temperature measuring transducer 56 to monitor temperature within the isostatic chamber, a high pressure gas pump 57 and a pressure transducer 58.

To accomplish the isostatic bond, gas pump 57 is started and the pressure is gradually increased in the chamber to the pressure required for the bond to be formed, e.g., 30,000 pounds per square inch is a typical pressure. The temperature may also be increased, depending on the materials being bonded. For example, for copper, a typical backing plate material, the temperature might typically be raised to a point somewhat below the melting point of the copper to increase the plasticity of the copper material.

The gas pressure in the chamber bears on the mold in all directions, and the mold is placed in high compressive stress. Strain accompanying the stress transfers pressure to the target material and backing plate inside the mold, and pressure is applied to the contacting surfaces where the bond is desired. Sufficient time is allowed for the necessary plastic deformation to take place, then, if the system has been heated, the temperature is lowered, the gas pressure is lowered, and the mold is removed from the isostatic chamber. The mold is opened, and the target structure, with the target material intimately joined to the back plate, is removed.

Figure 6A:
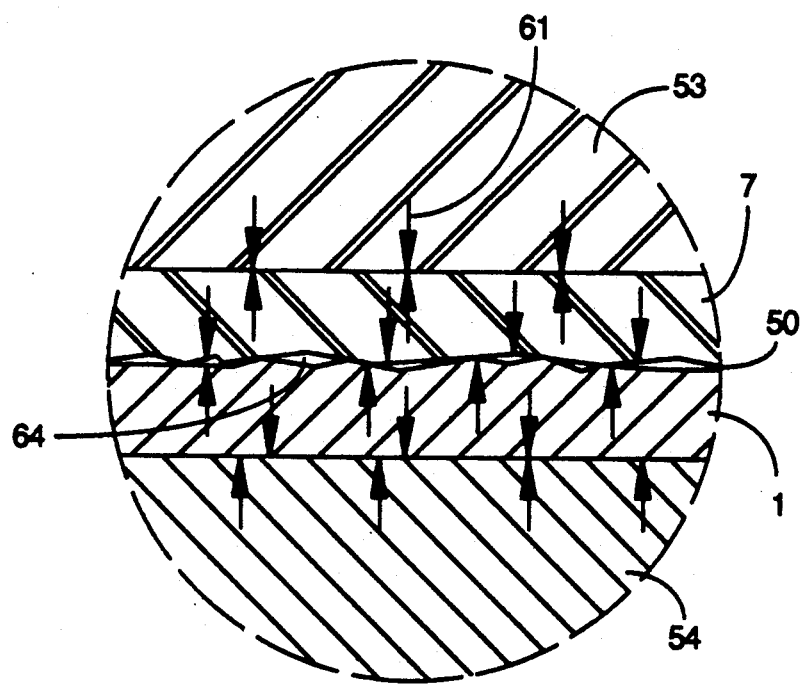
FIG. 6A is an idealized, blown-up view of the interface between the target and backing plate before isostatic pressing has begun.
Figure 6B:
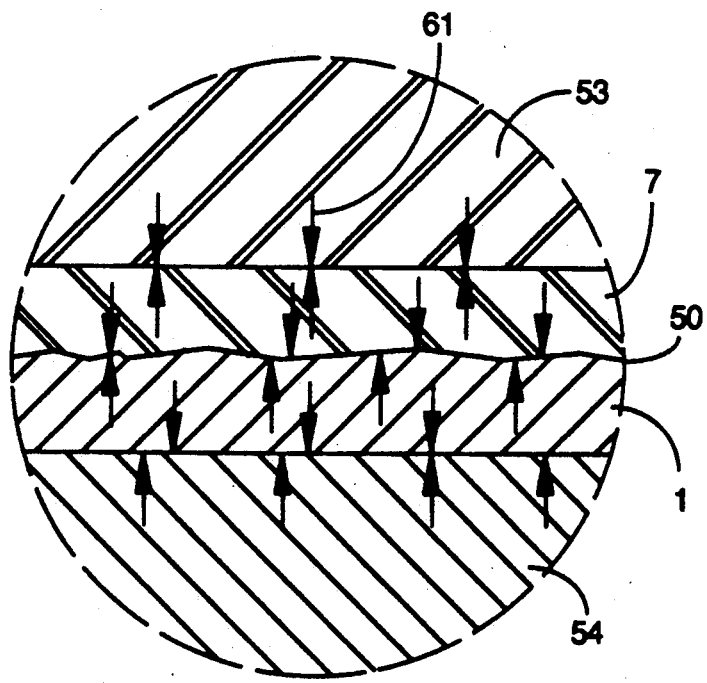
FIG. 6B is an idealized, blown-up view of the interface between the target and backing plate after isostatic pressing is complete.

FIG. 6A is an enlarged view of a portion 9 of the closed mold of FIG. 5C. Arrows 61 indicate the pressure transferred through the mold material 53 and both the sputtering material 7 and the backing plate material 1 coming to bear at the surface interface between the sputtering material and backing plate material. In FIG. 6A the interface 50 to be bonded is shown in an exaggerated way to be in contact at only a few points and to include empty spaces, by virtue of the limitations of the art of machining. FIG. 6B shows the condition at some time later after plastic flow of one or both of the sputtering material 7 and backing plate material 1 have taken place, and the microscopic gaps 64 of FIG. 6A have been closed. In FIG. 6B the two surfaces at interface 50 are in intimate contact at all points, and "cold welding" has occurred. Depending on the nature of the materials to be joined, the bonding is often enhanced by diffusion of the two materials into one another along the mating surface 50, a phenomenon known in the art as "diffusion bonding".

In this way the two materials are joined without the need for a third material between them, such as solder or adhesive which can cause problems because of low melting points or plastic deformation.

Figure 7:
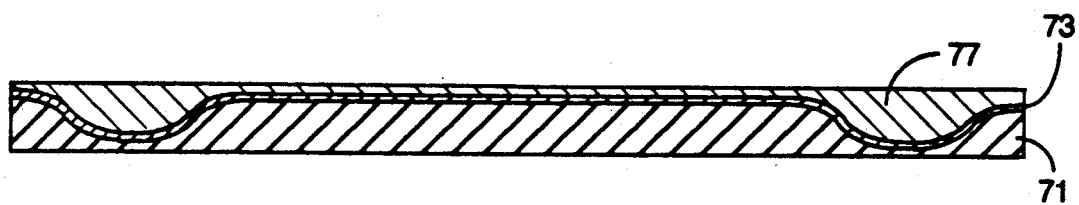
FIG. 7 shows a cross-sectional view of another embodiment of a composite target structure according to the invention.

In some instances however, a third material between the backing plate and target can be used to advantage. For example, where the backing plate material and the sputtering (target) material are such that sufficient plastic flow of one or the other cannot be attained at the pressure and temperature limitations of the isostatic chamber, a third material can be used to affect a bond if both the target material and the backing material will isostatically bond to the third material. In practice such a third material is chosen to have a high melting point relative to typical solder bonding materials and good thermal and electrical conductivity, so that the isostatic bond formed is not subject to the usual failure modes of either solder or adhesive bonds. FIG. 7 shows an example of such a composite structure. In a typical implementation, backing plate 71 and target 77 may be refractory metals with very low plasticity, and the third interstitial material 73 is comparatively softer, such as copper or aluminum.

Figure 8A:
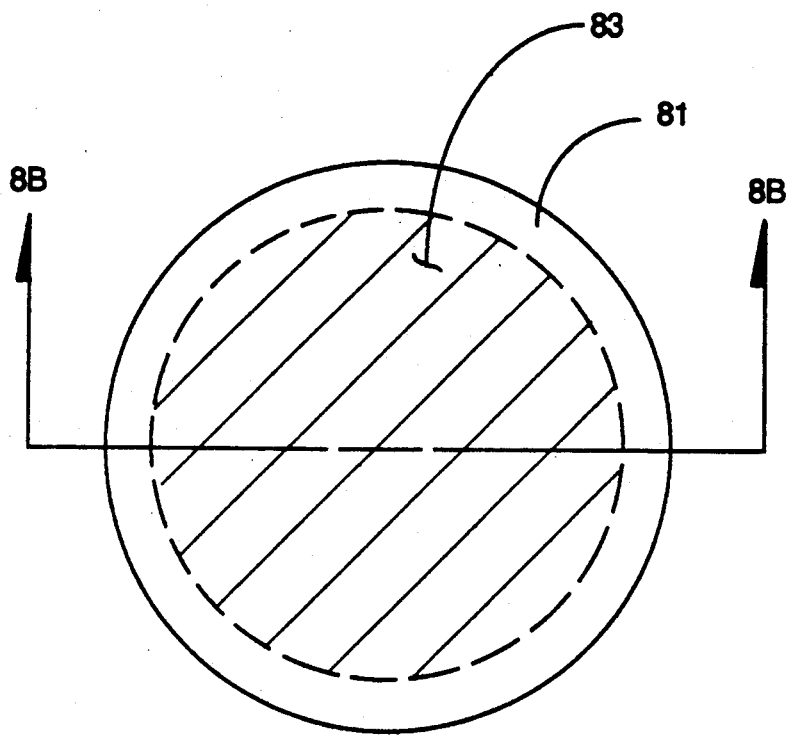
FIG. 8A shows a plan view of a target structure according to the invention for use in a round planar magnetron sputter coating source.
Figure 8B:
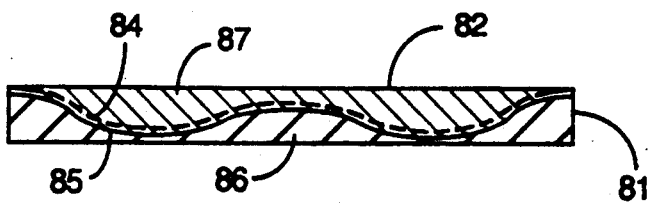
FIG. 8B shows a cross-sectional view of the target structure of FIG. 8A through a section A—A.

Another preferred embodiment of a composite target structure according to the invention is illustrated in FIGS. 8A, 8B. The structure there corresponds to a target for use with a round planar magnetron sputter coating source. Area 83 on the target face represents the region over which sputtering occurs. Target material 87 initially has an uneroded surface 82 which is eventually eroded to a layer having an end-of-life surface 84 lying just above the end-of-life profile 85 in a manner similar to the previous embodiment, and with the same high material effeciency.

Figure 9A:
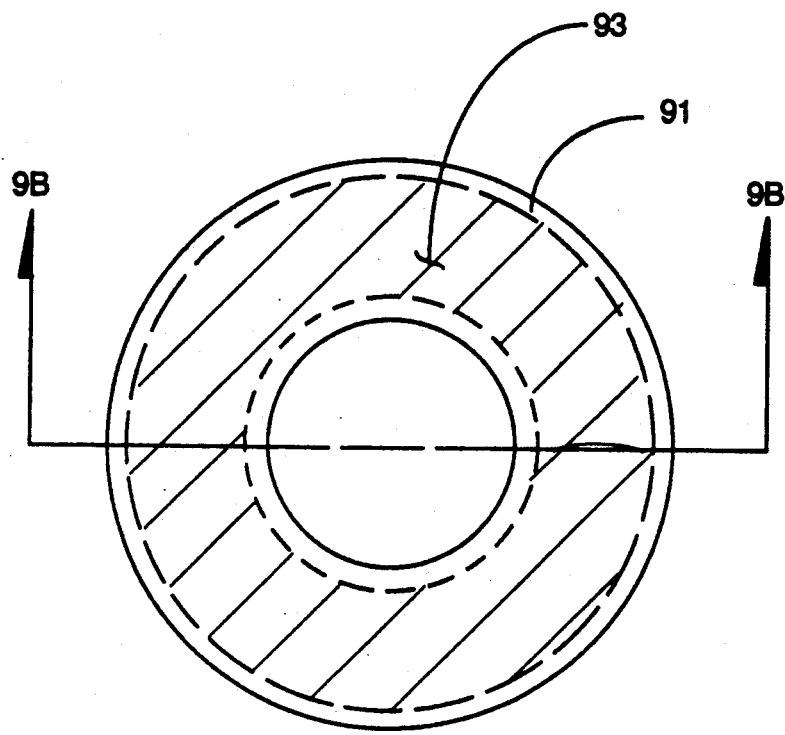
FIG. 9A shows a plan view of a target structure according to the invention for use in a conical magnetron sputter coating source.
Figure 9B:
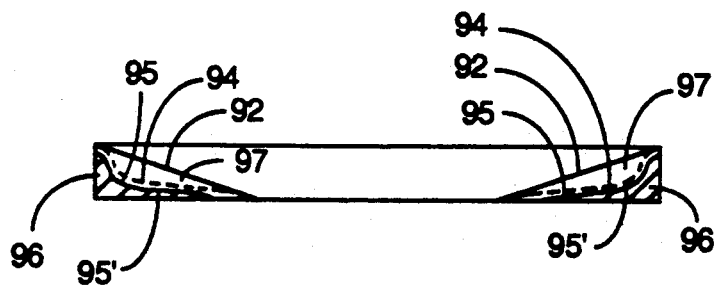
FIG. 9B shows a cross-sectional view of the target structure of FIG. 9A through a section A—A.

FIGS. 9A and 9B illustrate another preferred embodiment for a typical conical magnetron. Area 93 on the target face illustrates the area over which sputtering erosion occurs. The uneroded surface is 92 and the end-of-life surface is 94. Again the same high material efficiency results.

Figure 10A:
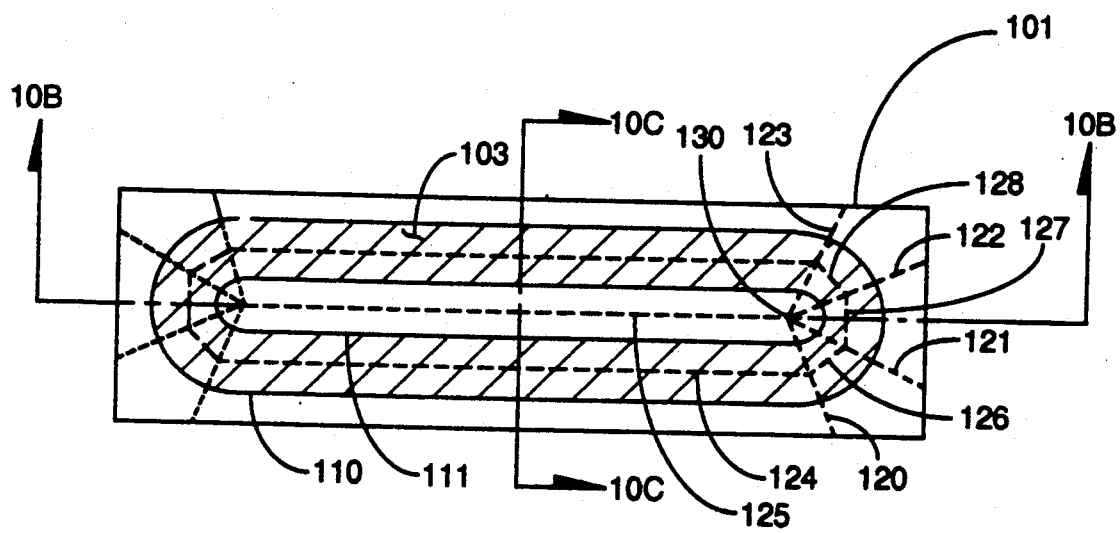
FIG. 10A shows a plan view of a composite target structure according to the invention for use in a rectangular planar magnetron sputter coating source.
Figure 10B:
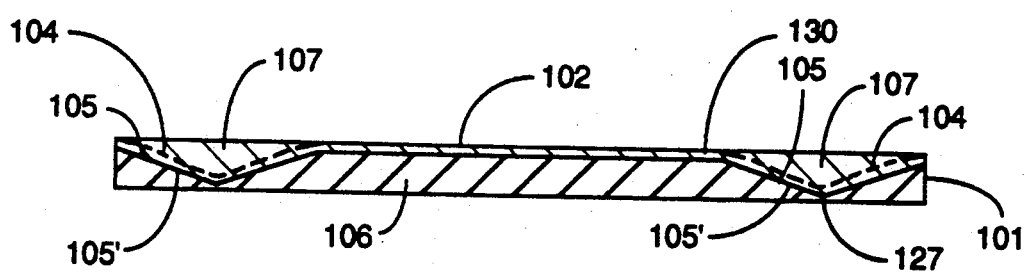
FIGS. 10B and 10C show cross-sectional views of the target structure shown in FIG. 10A through a section A—A, and a section B—B, respectively.
Figure 10C:
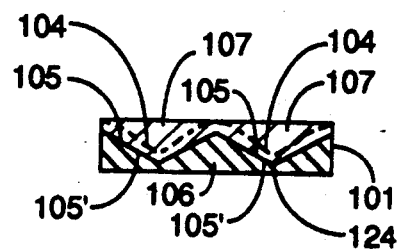

FIGS. 10A, 10B, and 10C illustrate another embodiment of the invention which is an approximation to that shown in FIGS. 4A, 4B, and 4C which can be used in a rectangular planar magnetron. In this embodiment, instead of forming a curvilinear surface to follow an end-of-life profile 104, the surfaces 105' on a backing plate 106, and the surfaces 105 on target material 107 are each made up of a plurality of planar surfaces which approximate the end-of-life profile. Lines 110 and 111, represent the approximate boundary limits of the sputtered area at end-of-life. The dotted lines 120 through 128, and point 130 represent the boundaries of the planes approximating the curvature of the end-of-life shape on the right half of the sputtering target structure. Surfaces 105 and 105' are again mated as in the curvilinear case of FIGS. 4A, 4B, and 4C. With this embodiment, a substantial portion of the target structure is still backing plate material rather than expensive target material, and the material efficiency is still enhanced over the prior art. Yet, because the mating surfaces 105 and 105' are made up of planar surfaces, they are generally much easier to machine. Clearly, the concept of this embodiment of using planar surfaces to approximate the end-of-life shape is equally applicable to the other planar and conical magnetron sources. Also, it will be apparent to those skilled in the art that by choosing a larger number of planar surfaces, the end-of-life shape may be more nearly approximated. In addition, in some applications, it may be advantageous to use a combination of planar and curvilinear surfaces to approximate the end-of-life shape.

Figure 11A:
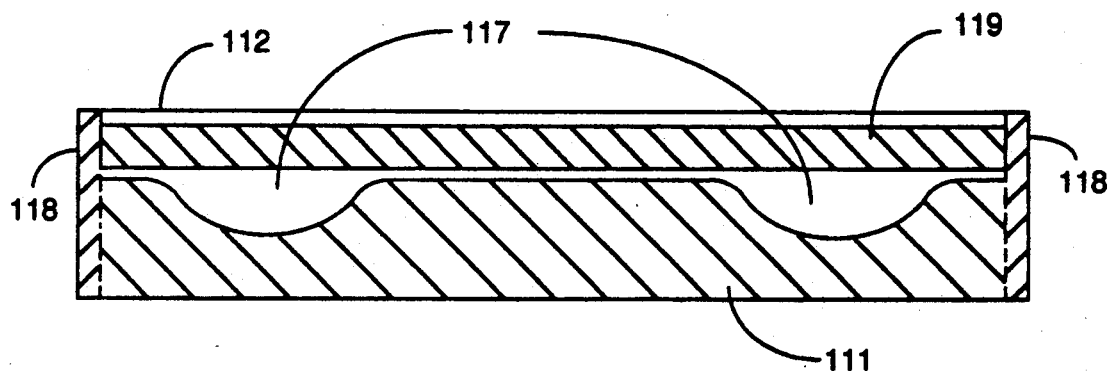
FIG. 11 shows a cross-sectional view of an alternative embodiment of the invention for use in a rectangular planar magnetron, adapted to construction techniques for powder metallurgy.
FIG. 11B shows a cross-sectional view of the target structure of FIG. 11A upon completion of machining.
Figure 11B:
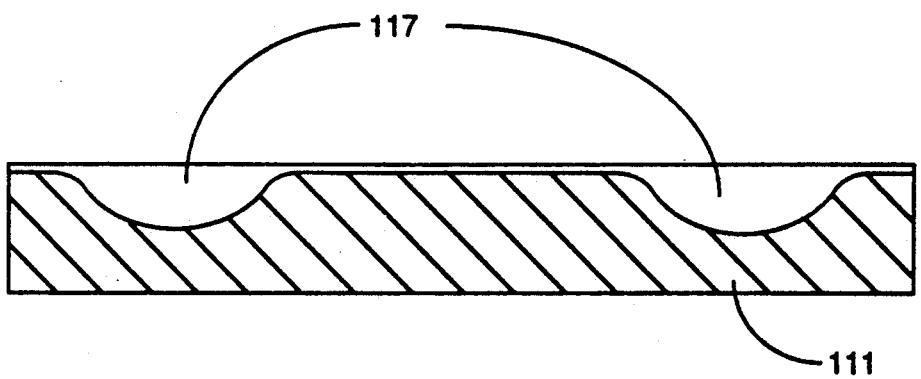

FIGS. 11A and 11B show an alternative embodiment which is particularly adapted to the techniques of powder metallurgy. In suitable circumstances, a backing plate 111 may be extended to become a portion of the mold used in an isostatic pressing operation. In this embodiment, the backing plate is made to conform substantially to the end-of-life profile, and a sputtering material 117 is introduced as a powder. The backing plate is molded or machined with an extension 118 around its periphery in order to contain the powder and to allow the mold to be closed at the upper extremity. A ceramic insert 119 is then placed over the powder to prevent adhesion and a thin metallic sheet 112 is placed over the insert and sealed to extension 118 to form a closed system, hereinafter called a can. The isostatic pressing process is then performed as described earlier, causing the powder particles to become diffusion bonded to each other and causing this bonded mass to become bonded to the backing plate material. The can is then opened, the ceramic insert 119 is removed, and the backing plate extension 118 is machined away leaving a composite target as illustrated in FIG. 11B.

An important advantage in each of the above embodiments is that once the end-of-life profile for a particular sputter coating source is known, composite targets can be prepared so that the amount of expensive sputtering material left at end-of-life is minimal, and the material efficiency for the end user is maximized.

Another advantage is that the power density that can be used with a profiled bonded target according to the invention is higher than can be used with a target where most or all the material is the sputtering material. In nearly all cases the heat transfer coefficient by conduction of the sputtering material is less than that of the backing plate material. Since heating of the target takes place at the eroding surface as a result of the kinetic energy of arriving accelerated ions being degraded to heat, and since cooling of the target must be done from the opposite side, adjacent to the sputtering source, heat must be transferred through the thickness of the target structure to keep the eroding surface below the melting point of the sputtering material. If most or all of the target is the sputtering material, the resistance to heat transfer will be greater than if a significant part of the target structure is backing plate material with low resistance to heat transfer. At a given target surface temperature, therefore, the composite target structure according to the invention can be operated at a higher power density, hence at a higher deposition rate, than can a target which is all sputtering material.

While the preferred embodiments of the present invention have been shown and described, it will be apparent to those skilled in the art that many changes and modifications may be made without departing from the invention in its broader respects. Therefore, the appended claims are intended to cover all such modifications, changes, and applications that fall within the true spirit and scope of the invention. Also, it will be apparent to those skilled in the art that the above invention is restricted to magnetically enhanced diode sputtering sources, rather than triode and other sources whose end-of-life shape more nearly approximates the shape of the planar target material of which they are comprised. In addition, cylindrical hollow cathode sources are excluded as well.

What is claimed is:

1. A composite sputtering target structure for use in a magnetron sputtering source, comprising:

a target of a first material to be sputter deposited onto a substrate, said target having a substantially planar front surface and a nonplanar back surface generally opposing said front surface, said target also having a central region and a peripheral region;

a backing plate of a second material, said backing plate having a nonplanar bonding surface complementary in shape to said nonplanar back surface, and a substantially planar mating surface generally opposing said bonding surface and adapted to mate with said magnetron sputtering source;

said target and said backing plate being bonded together with said back surface adjacent said bonding surface, said backing plate being substantially coextensive with said target, and said front surface being generally parallel to said mating surface;

wherein the thickness of said target is substantially greater in at least a part of said peripheral region than in the central region.

2. A method of making a composite sputtering target structure for use in a magnetron sputtering source, comprising the steps of:

placing a test blank in a magnetron sputtering source;
   sputtering said test blank until end-of-life is achieved;
   determining the end-of-life profile of the sputtered surface;
   preparing a target of a first material to be sputter deposited onto a substrate, said target having a substantially planar front surface and a nonplanar back surface generally opposing said front surface, said non-planar back surface being profiled to substantially match the profile of said end-of-life profile;
   preparing a backing plate of a second material, said backing plate having a nonplanar bonding surface complementary in shape to said nonplanar back surface, and a substantially planar mating surface generally opposed to said bonding surface and adapted to mate with said magnetron sputtering source; and
   bonding said backing plate and said target together with said bonding surface adjacent said back surface, said backing plate being substantially coextensive with said target, and said front surface being generally parallel to said mating surface.

3. A composite sputtering target structure produced by the process of claim 2.

* * * * *